(12) United States Patent
Zhou

(10) Patent No.: US 10,515,876 B1
(45) Date of Patent: Dec. 24, 2019

(54) METHOD FOR FORMING SEMICONDUCTOR DEVICE AND SEMICONDUCTOR DEVICE FABRICATED BY THE SAME

(71) Applicant: UNITED MICROELECTRONICS CORP., Hsinchu (TW)

(72) Inventor: Zhi-Biao Zhou, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/159,789

(22) Filed: Oct. 15, 2018

(30) Foreign Application Priority Data

Aug. 23, 2018 (CN) .......................... 2018 1 0968332

(51) Int. Cl.
| | | |
|---|---|---|
| *H01L 21/4763* | (2006.01) | |
| *H01L 23/482* | (2006.01) | |
| *H01L 23/64* | (2006.01) | |
| *H01L 21/768* | (2006.01) | |
| *H01L 23/528* | (2006.01) | |
| *H01L 21/764* | (2006.01) | |
| *H01L 23/522* | (2006.01) | |

(52) U.S. Cl.
CPC ........ *H01L 23/4821* (2013.01); *H01L 21/764* (2013.01); *H01L 21/76807* (2013.01); *H01L 23/528* (2013.01); *H01L 23/5222* (2013.01); *H01L 23/642* (2013.01)

(58) Field of Classification Search
CPC ............. H01L 23/53295; H01L 21/764; H01L 21/3114; H01L 21/7682; H01L 23/5329; H01L 21/76832; H01L 2221/1042; H01L 29/666545
USPC ......... 438/619, 622, 634; 257/635, 637, 758
See application file for complete search history.

(56) References Cited

U.S. PATENT DOCUMENTS

| | | | |
|---|---|---|---|
| 6,211,057 B1 | 4/2001 | Lin et al. | |
| 6,861,332 B2 | 3/2005 | Park et al. | |
| 7,138,329 B2 * | 11/2006 | Lur ..................... | H01L 21/7682 438/619 |
| 7,449,407 B2 * | 11/2008 | Lur ................... | H01L 21/76807 257/E21.573 |
| 2017/0186683 A1 * | 6/2017 | Lin ........................ | H01L 23/528 |
| 2018/0076141 A1 * | 3/2018 | Wu ................... | H01L 21/76816 |
| 2018/0122738 A1 * | 5/2018 | Wu ....................... | H01L 23/528 |

* cited by examiner

*Primary Examiner* — S. V. Clark
(74) *Attorney, Agent, or Firm* — WPAT, PC

(57) ABSTRACT

A method for forming a semiconductor device includes: providing a structure having a first stop layer formed above a substrate, a first dielectric layer formed on the first stop layer, a second stop layer formed on the first dielectric layer, and conductive lines formed in the first dielectric layer and spaced apart from each other; forming a first dummy layer on the second stop layer; patterning the first dummy layer to form a first patterned dummy layer; forming a second dummy layer on the first dummy layer to form a first trench; etching back the second dummy layer and the first patterned dummy layer to form a second trench, wherein the second trench is self-aligned with the first trench. The second trench extends downwardly to the first dielectric layer and forms an opening at the second stop layer.

20 Claims, 10 Drawing Sheets

METHOD FOR FORMING SEMICONDUCTOR DEVICE AND SEMICONDUCTOR DEVICE FABRICATED BY THE SAME

This application claims the benefit of People's Republic of China application Serial No. 201810968332.7, filed Aug. 23, 2018, the subject matters of which is incorporated herein by references.

BACKGROUND

Technical Field

The disclosure relates in general to a method for forming a semiconductor device and a semiconductor device fabricated by the same, and more particularly to a method for forming a semiconductor device having an air-gap and a semiconductor device fabricated by the same.

Description of the Related Art

Reduction of feature size, improvements of the rate, the efficiency, the density and the cost per integrated circuit unit are the important goals in the semiconductor technology. The electrical properties of the semiconductor device have to be maintained even improved with the decrease of the size of the semiconductor device for meeting the requirements of commercial products in the applications. However, the process for fabricating a patterned configuration becomes more difficult when the size of the semiconductor device is reduced. For example, the conventional method for forming trenches between two adjacent components, such as between adjacent conductive lines or contacts, suffers from precision of fine patterning, especially when the pitch between adjacent components is reduced.

SUMMARY

The disclosure is directed to a method for forming a semiconductor device and a semiconductor device fabricated by the same, wherein an air-gap can be formed between two adjacent conductive lines, thereby significantly reducing the parasitic capacitance.

According to one embodiment of the present disclosure, a method for forming a semiconductor device is provided. A structure, comprising a first stop layer formed above a substrate, a first dielectric layer formed on the first stop layer, a second stop layer formed on the first dielectric layer, and conductive lines formed in the first dielectric layer and spaced apart from each other, is provided. A first dummy layer is formed on the second stop layer, and the first dummy layer is patterned to form a first patterned dummy layer. A second dummy layer is then formed on the first patterned dummy layer to form a first trench. The second dummy layer and the first patterned dummy layer are etched back to form a second trench, wherein the second trench is self-aligned with the first trench. The second trench extends downwardly to the first dielectric layer and forms an opening at the second stop layer.

According to one embodiment of the present disclosure, a semiconductor device is provided, including a first stop layer formed above a substrate; a first dielectric layer formed on the first stop layer; conductive lines formed in the first dielectric layer and spaced apart from each other; a second stop layer formed on the first dielectric layer and having an opening; and an air-gap formed within the first dielectric layer and positioned between two of the conductive lines disposed adjacently, wherein the first stop layer has another opening communicating the air-gap.

The disclosure will become apparent from the following detailed description of the preferred but non-limiting embodiments. The following description is made with reference to the accompanying drawings.

DETAILED DESCRIPTION

Figure 1A:
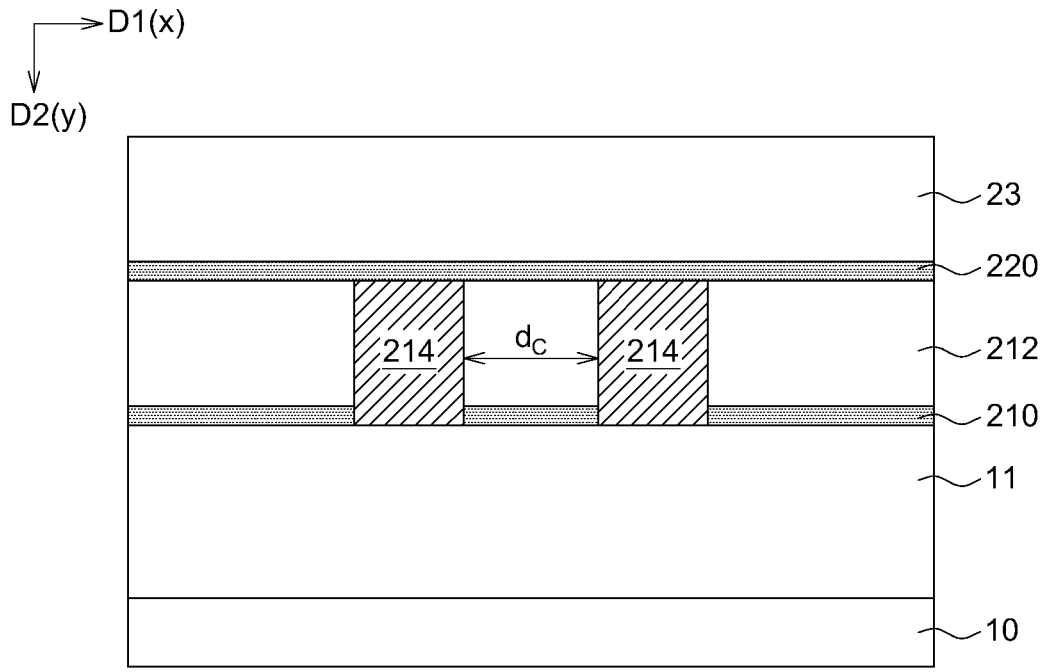
FIG. 1A-FIG. 1F show a method for forming a semiconductor device according to the first embodiment of the disclosure.

In the embodiments of the present disclosure, a method for forming a semiconductor device and a semiconductor device fabricated by the same are provided. According to a method of forming a semiconductor, an air-gap can be formed between two adjacent conductive lines, thereby significantly reducing the parasitic capacitance, especially reducing the parasitic capacitance in the structure fabricated in the BEOL (back end of line) process. In the forming method of the embodiment, two dummy layers (e.g. dummy dielectric layers) are provided for forming the air gaps, wherein a hole with a large critical dimension (CD) is formed at the first dummy layer, followed by depositing a second dummy layer for reducing the critical dimension of the hole and forming a first trench with small critical dimension. Then, the pattern of the first trench is transferred to the dielectric layer surrounding the conductive lines, such as by using an etching back process, to form a second trench. The dielectric material between two adjacent conductive lines is then removed through the second trench, thereby forming an air-gap within the first dielectric layer. Thus, according to the method of the embodiment, an air-gap between two adjacent conductive lines can be formed without using a higher grade mask for defining metal lines (e.g. Cu lines); accordingly, the production cost does not increase. Additionally, the method of the embodiment forms an opening with a small critical dimension (CD) in one or more stop layers (such as an etch stop layer) by using a self-aligned process. Moreover, according to the method of the embodiment, an air-gap with a big CD can be generated between adjacent conductive lines, thereby significantly reducing the parasitic capacitance and preventing the related components from undesirable damages during the fabrication. Thus, the electronic characteristics and production yield of the semiconductor device can be effectively improved by applying a simple embodied method without increasing the production cost.

The embodiments are described in details with reference to the accompanying drawings for illustrating the forming method and related structure of the disclosure. The disclosure can be applied to an silicon-on-insulator (SOI) structure, such as a structure of silicon transistor formed on an insulating layer. However, the disclosure is not limited to the applications of SOI structures. The present disclosure is applicable to a BEOL (back end of lines) process for manufacturing a semiconductor device, but the applications of the present disclosure are not limited thereto. It is possible to implement the present disclosure as long as it is required to form an air gap between adjacent conductive lines of a semiconductor device. Thus, it is noted that the described details of the embodiments are provided for exemplification, and not intended to limit the present disclosure. Accordingly, it is noted that not all embodiments of the disclosure are shown. There may be other embodiments of the present disclosure which are not specifically illustrated. Modifications and variations can be made without departing from the spirit of the disclosure to meet the requirements of the practical applications. Further, the accompany drawings are simplified for clear illustrations of the embodiment; sizes and proportions in the drawings are not directly proportional to actual products, and shall not be construed as limitations to the present disclosure. Thus, the specification and the drawings are to be regard as an illustrative sense rather than a restrictive sense.

Moreover, use of ordinal terms such as "first", "second", "third", etc., in the specification and claims to modify an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements. Also, the terms for describing spatial relationship between two elements/features, such as beneath", "below", "lower", "upper", "above", "on", etc., can be referred to the spatial relationship between one element/feature and another element/feature, unless specially defined. It will be apparent to those skilled in the art that those spatially-related terms include not only the configuration/position of the elements as shown in the figures, but also the configuration/position of the elements in the use or operation. Therefore, the terms in the specification and claims are used for describing the embodiments, and are not intended to limit the scope of the disclosure. Additionally, the identical and/or similar elements of the embodiments are designated with the same and/or similar reference numerals for clear illustration.

First Embodiment

In the first embodiment, a configuration of conductive lines (such as metal lines) formed above a substrate is exemplified for illustrating the formation of an air-gap formed between the conductive lines disposed adjacently. FIG. 1A-FIG. 1F show a method for forming a semiconductor device according to the first embodiment of the disclosure.

As shown in FIG. 1A, a structure is provided, wherein the structure includes a first stop layer 210 formed above a substrate 10, a first dielectric layer 212 formed on the first stop layer 210, a second stop layer 220 formed on the first dielectric layer 212, and several conductive lines 214 formed in the first dielectric layer 212 and spaced apart from each other. According to one embodiment, a first dummy layer 23 is formed on the second stop layer 220. In one example, other material, for example, an insulating layer such as a lower dielectric layer 11, can be formed between the substrate 10 and the first stop layer 210. As shown in FIG. 1A, two of the conductive lines disposed adjacently are spaced apart from each other by a distance $d_C$ along the first direction D1 (e.g. x-direction). In one embodiment, the first stop layer 210 and the second stop layer 220 can be made of the same material, such as silicon nitride. The lower dielectric layer 11, the first dielectric layer 212 and the first dummy layer 23 can be made of the same material, such as silicon nitride or any dielectric material with dielectric constant less than 4. Typically, silicon nitride as the material of an etch stop layer has a slower etching rate; for example, an etching rate of the silicon nitride material is about ¼ to ¹⁄₁₀ of an etching rate of the silicon oxide material.

Figure 1B:
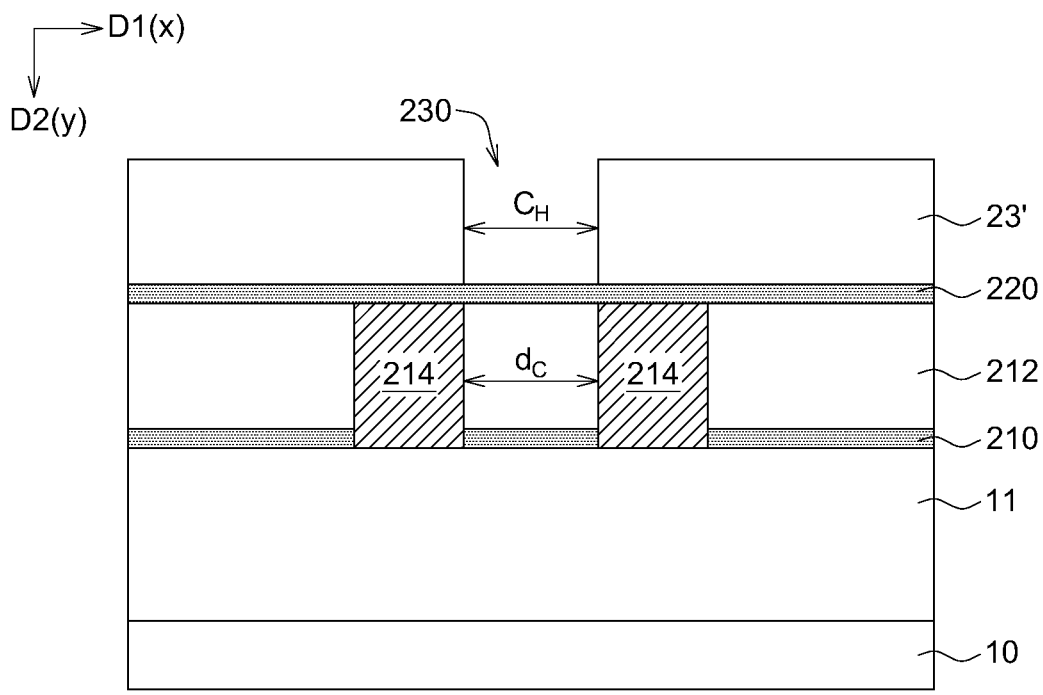

As shown in FIG. 1B, the first dummy layer 23 is patterned to form a first patterned dummy layer 23' having a hole 230. In one example, the hole 230 has a critical dimension $C_H$ along the first direction (e.g. x-direction), wherein this critical dimension $C_H$ could be approximate to, identical to or even greater than the distance $d_C$ between two conductive lines 214 disposed adjacently. In one example, a mask for defining the conductive lines (such as cupper lines) can be (but not limitedly) used for patterning the first dummy layer 23; consequently, the critical dimension $C_H$ of the hole 230 is approximate to the distance $d_C$ between two conductive lines 214 disposed adjacently.

Figure 1C:
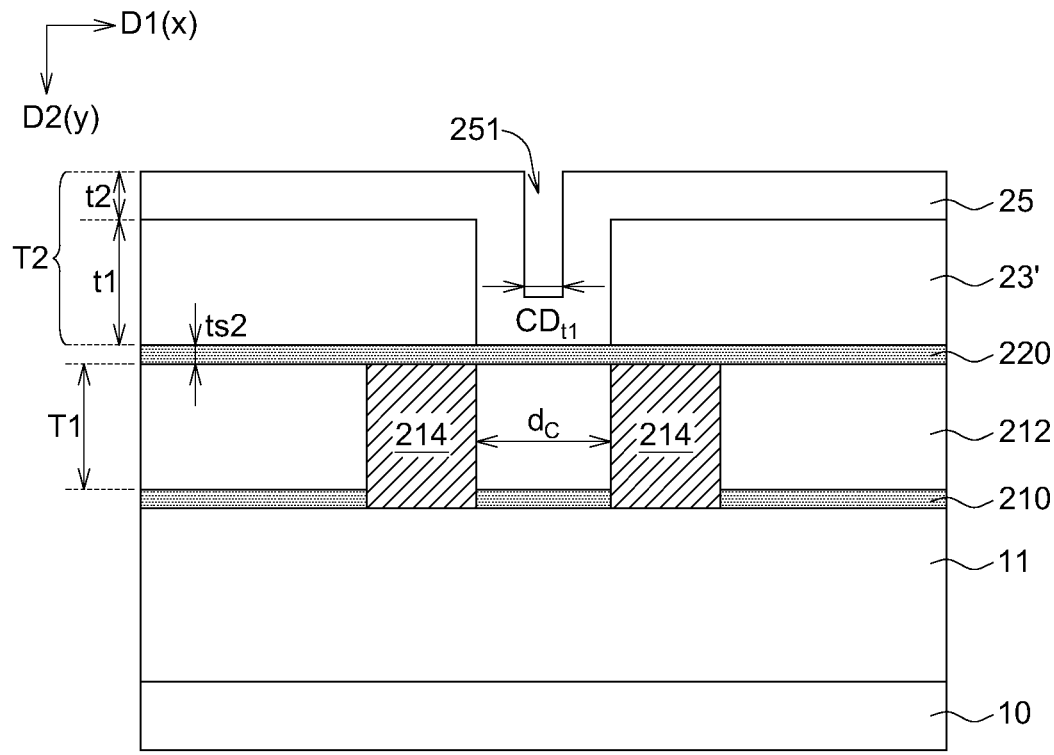

Afterwards, as shown in FIG. 1C, a second dummy layer 25 is formed on the first patterned dummy layer 23' to form a first trench 251.

Accordingly, there is no need to use a fine mask with higher grade than the mask for defining metal lines (such as Cu lines) for forming the first trench 251. The embodiment provides a method for reducing the critical dimension $C_H$ of the hole 230 by depositing the second dummy layer 25 on the first patterned dummy layer 23', thereby forming the first trench 251 with a critical dimension smaller than the critical dimension $C_H$ of the hole 230.

Figure 1D:
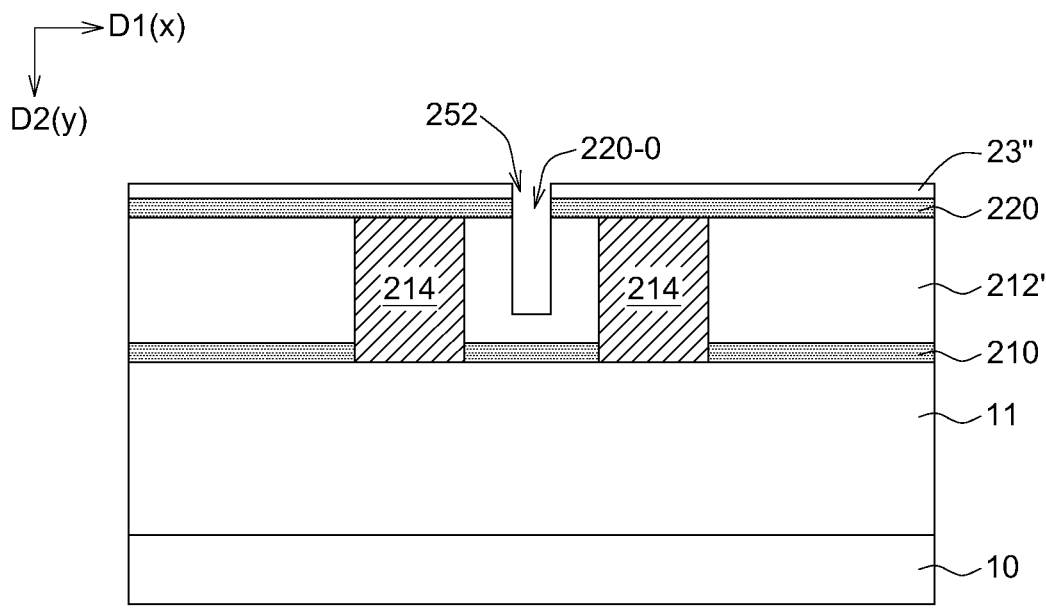

Then, as shown in FIG. 1D, a step of etching back the second dummy layer 25 and the first patterned dummy layer 23' is performed to create a second trench 252, wherein the second trench 252 is self-aligned with the first trench 251. The second trench 252 extends downwardly to the first dielectric layer 212 and forms an opening 220-O at the second stop layer 220. In one embodiment, the first dummy layer 23 and the second stop layer 25 can be made of different materials with different etching rates. In another embodiment, the first dummy layer 23 and the second stop layer 25 can be made of the same material, such as silicon oxide.

Additionally, in one embodiment, the first dummy layer 23 has a first thickness t1 and the second dummy layer 25 has a second thickness t2, a sum T2 of the first thickness t1 and the second thickness t2 is equal to or greater than a thickness T1 of the first dielectric layer 212 (i.e. T1≤T2, T2=t1+t2), as shown in FIG. 1C. Also, in one example, the sum T2 of the first thickness t1 and the second thickness t2 is (but not limited to) greater than two times of a thickness ts2 of the second stop layer 220. Also, in one example, a thickness of the second dummy layer 25 (i.e. the second thickness t2) is (but not limited to) less than ½ of a critical dimension $CD_{t1}$ of the first trench 251. In another example, a thickness of the second dummy layer 25 is (but not limitedly) in a range of ¼ to ⅓ of a critical dimension $CD_{t1}$ of the first trench 251. Noted that those numerical ratios and/or ranges are provided for exemplification, not for limitation.

Figure 1E:
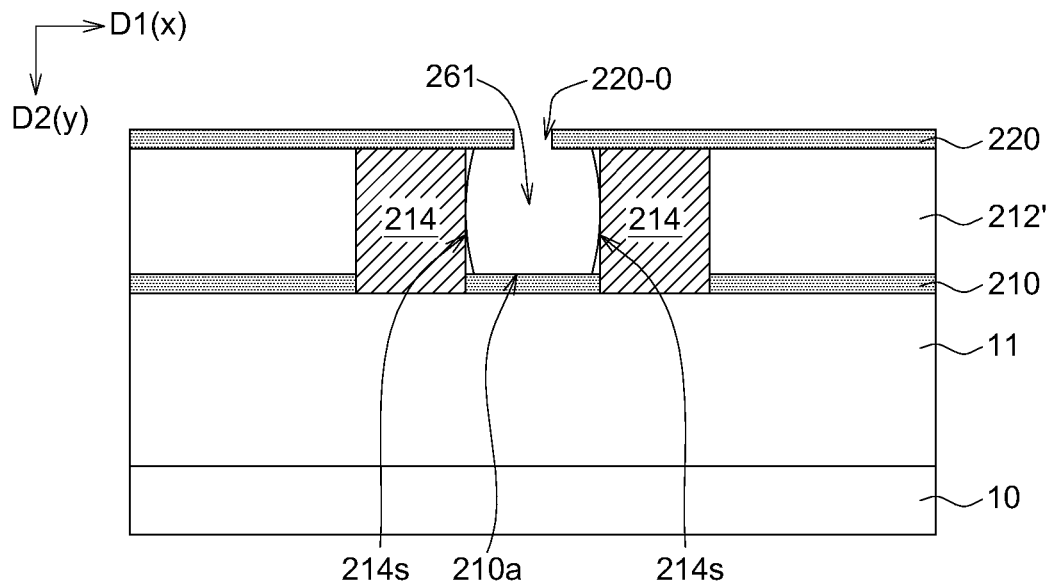

As shown in FIG. 1E, a portion of the first dielectric layer 212' is then removed through the opening 220-O at the second stop layer 220, thereby forming an air-gap 261 within the first dielectric layer 212'. The air-gap 261 is formed between two of the conductive lines 214 disposed adjacently. In one embodiment, an etchant can be introduced into the first dielectric layer 212' through the opening 220-O and the second trench 252, and at least a portion of the first dielectric layer 212' between adjacent conductive lines 214 can be removed by wet etching.

In one example, the outer sidewalls 214s of two conductive lines 214 disposed adjacently are at least partially exposed by the air-gap 261 within the first dielectric layer 212'. As shown in FIG. 1E, the portion of the first dielectric layer 212' between two adjacent conductive lines 214 has not been removed completely, and the air-gap 261 exposes parts of the outer sidewalls 214s of the conductive lines 214. Therefore, after the air gap 261 is formed, a portion of the first dielectric layer may remain on the sidewall of the conductive lines 214; for example, the material of the first dielectric layer is still remained at the corners of the sidewalls of the conductive lines 214 near the second stop layer 220 and near the first stop layer 210, as shown in FIG. 1E. However, the disclosure is not limited thereto. In other examples, the first dielectric layer between two adjacent conductive lines 214 can be completely removed by adjusting the etching conditions, wherein the opposite sidewalls of the adjacent conductive lines 214 are fully exposed by the air gap 261. Also, in one example, the aft gap 261 may (but not limitedly) expose a part of a top surface 210a of the first stop layer 210.

Figure 1F:
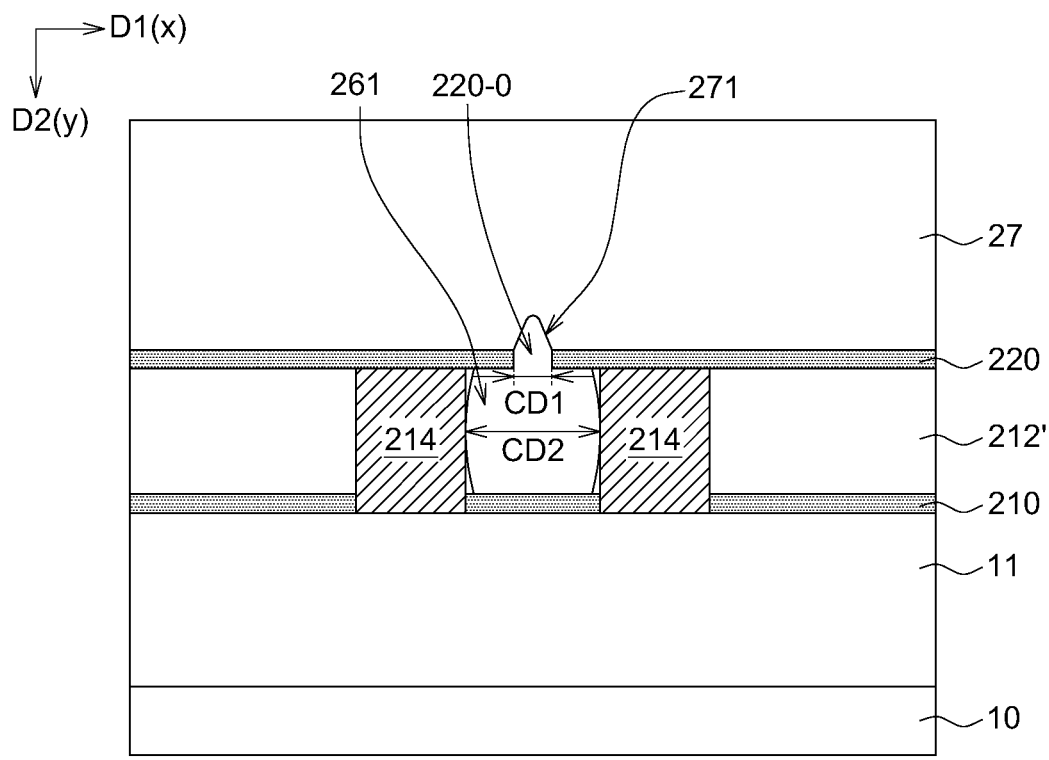

As shown in FIG. 1F, a capping dielectric layer 27 is then formed on the second stop layer 220 by deposition.

According to the embodiment, the opening 220-O at the second stop layer 220 has a first critical dimension CD1 along the first direction D1 (such as x-direction), and the air-gap 261 within the first dielectric layer 212' has a second critical dimension CD2 along the first direction D1, wherein the first critical dimension CD1 is smaller than the second critical dimension CD2, as shown in FIG. 1F. In one example, the first critical dimension CD1 is equal to or less than at least ⅓ of the second critical dimension CD2.

According to the method of the embodiment, since the opening 220-O at the second stop layer 220 is small in size (e.g., the second critical dimension CD2), it is less likely that the dielectric material is dropped into the air gap 261 when the capping dielectric layer 27 is deposited. Moreover, a void consisted of the opening 220-O and a slit above the opening 220-O can be maintained by adjusting the size of the opening 220-O and modifying the process conditions, and the parasitic capacitance of a semiconductor device in the application can be further reduced. In one embodiment, as shown in FIG. 1F, an air portion 271 is formed in the capping dielectric layer 27 corresponding to a position of the opening 220-O at the second stop layer 220, wherein the air portion 271 and the air-gap 261 communicate each other through the opening 220-O. During fabrication, the air portion 271 can be generated by decreasing the size of the opening 220-O at the second stop layer 220, and/or modifying the deposition rate of the capping dielectric layer 27. For example, the air portion 271 can be generated by initially depositing the capping dielectric layer with a faster deposition rate, followed by a slower deposition rate.

In one application, the capping dielectric layer 27 can be an inter-metal dielectric (IMD) having a low-k dielectric constant, such as a material with a dielectric constant less than 3, if more conductive lines (such as more metal lines) are formed above the capping dielectric layer as needed. In other application, the capping dielectric layer 27 can be a material having a high-k dielectric constant if it serves as a final protection layer (i.e. no more conductive/metal lines formed on the capping dielectric layer 27 subsequently); for example, the capping dielectric layer 27 can be a material of undoped silicate glass (USG), tetraethoxysilane (TEOS, k=4.2) or the likes.

The disclosure is not limited to the above-described embodiments, and the semiconductor device in the application may include, for example, a transistor or other components; also, the embodiment provided herein may omit details of some components or layers for clarity of illustration. Therefore, the disclosure also includes other embodiments which are not specifically illustrated.

Figure 2:
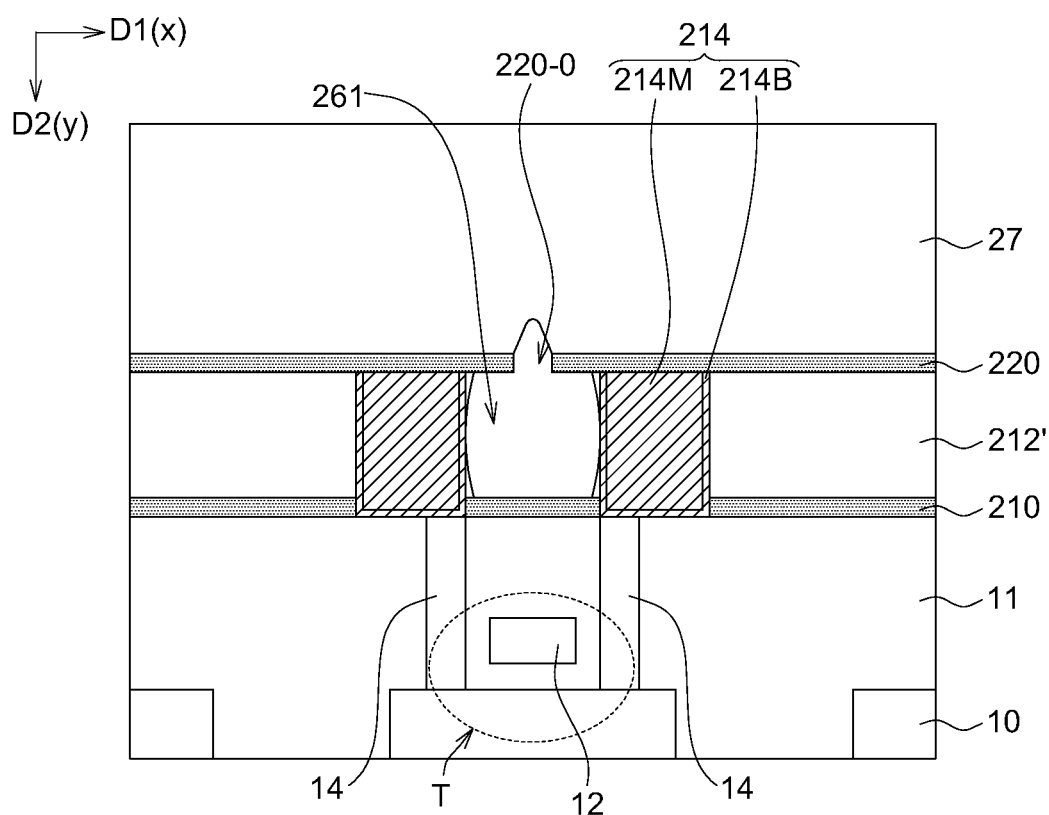
FIG. 2 depicts a cross-sectional view of another semiconductor device formed by the first embodiment of the disclosure.

FIG. 2 depicts a cross-sectional view of another semiconductor device formed by the first embodiment of the disclosure. The identical and/or similar elements of FIG. 2 and FIG. 1F are designated with the same and/or similar reference numerals for clear illustration. As shown in FIG. 2, the semiconductor device further comprises a transistor T formed on the substrate 10. The transistor T is formed in the lower dielectric layer 11, and the first stop layer 210 is formed above the transistor T, wherein the conductive lines 214 are electrically connected to the transistor T. For example, the conductive lines 214 are electrically connected to the transistor T by the conductive contacts 14 formed within the lower dielectric layer 11. Additionally, each of the conductive lines 214 may include a barrier liner 214B and a metal portion 214M, as shown in FIG. 2. Material examples of the barrier liner 214B include Ti/TiN, Ta/TaN or other suitable materials. Material examples of the metal portion 214M include copper and other metals. According to the embodied method as illustrated above, the barrier liner 214B of the conductive line can be partially or fully exposed by the air-gap 261'.

Figure 3:
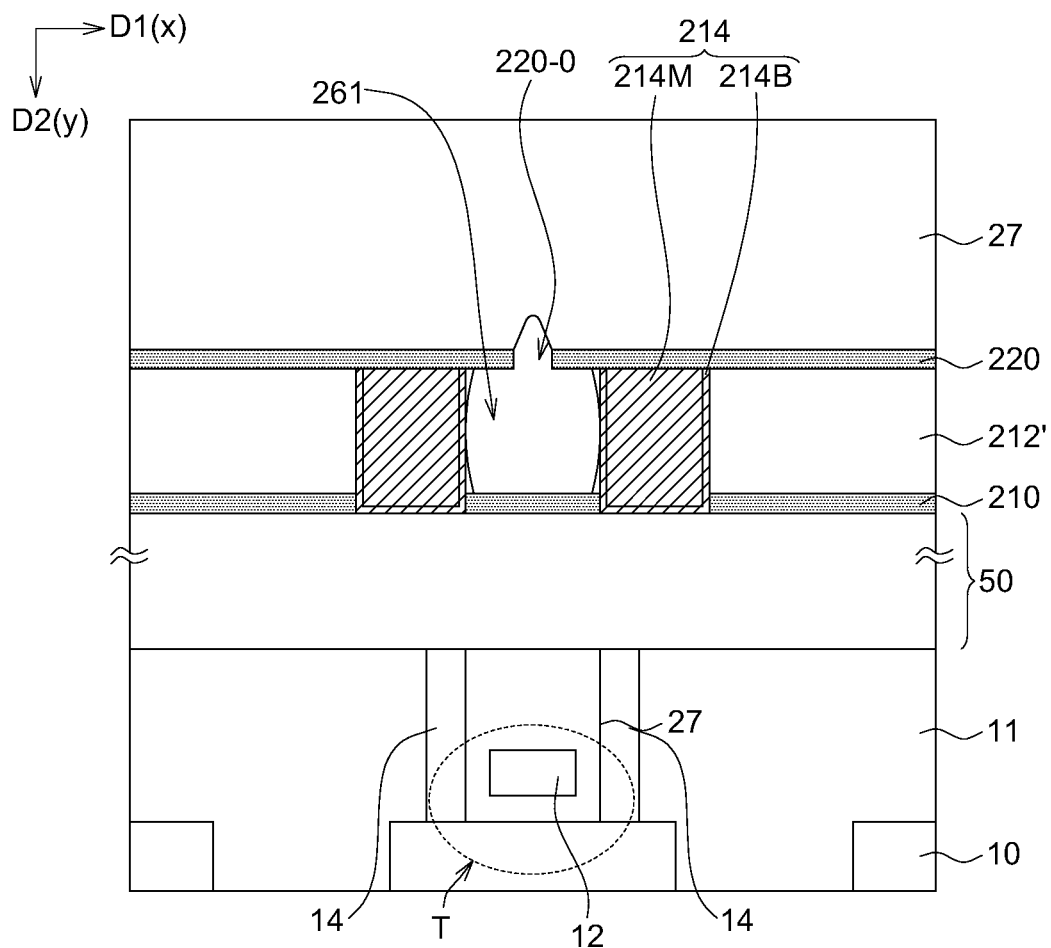
FIG. 3 depicts a cross-sectional view of a further semiconductor device formed by the first embodiment of the disclosure.

Additionally, several layers of interconnections can be included in the semiconductor device for the actual needs of the practical applications. FIG. 3 depicts a cross-sectional view of a further semiconductor device formed by the first embodiment of the disclosure. The identical and/or similar elements of FIG. 3 and FIGS. 1F and 2 are designated with the same and/or similar reference numerals for clear illustration. As shown in FIG. 3, this semiconductor device further includes an interconnecting layer 50 above the substrate 10, such as formed between the transistor T and the first stop layer 210. Details of the other elements such as the opening 220-O and the air-gap 261, which have been described above, are not redundantly repeated.

Second Embodiment

The method of the second embodiment is similar to the method of the first embodiment. The difference between the first and second embodiments is that the second trench of the second embodiment penetrates two adjacent stop layers and forms two air gaps within two adjacent dielectric layers.

Figure 4A:
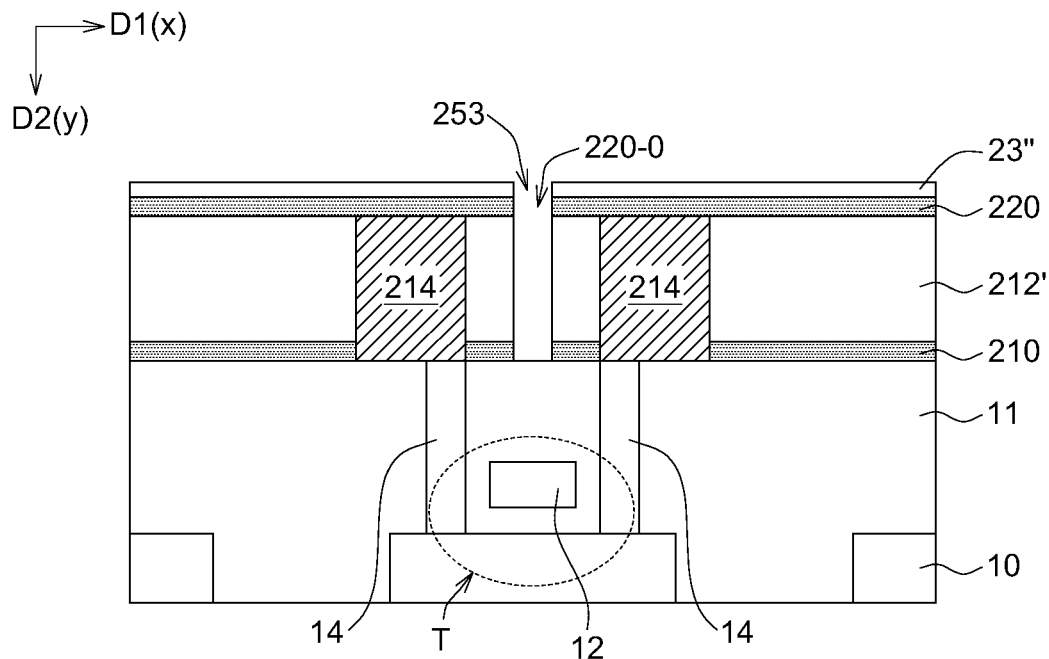
FIG. 4A-FIG. 4C show a method for forming a semiconductor device according to the second embodiment of the disclosure.
Figure 4B:
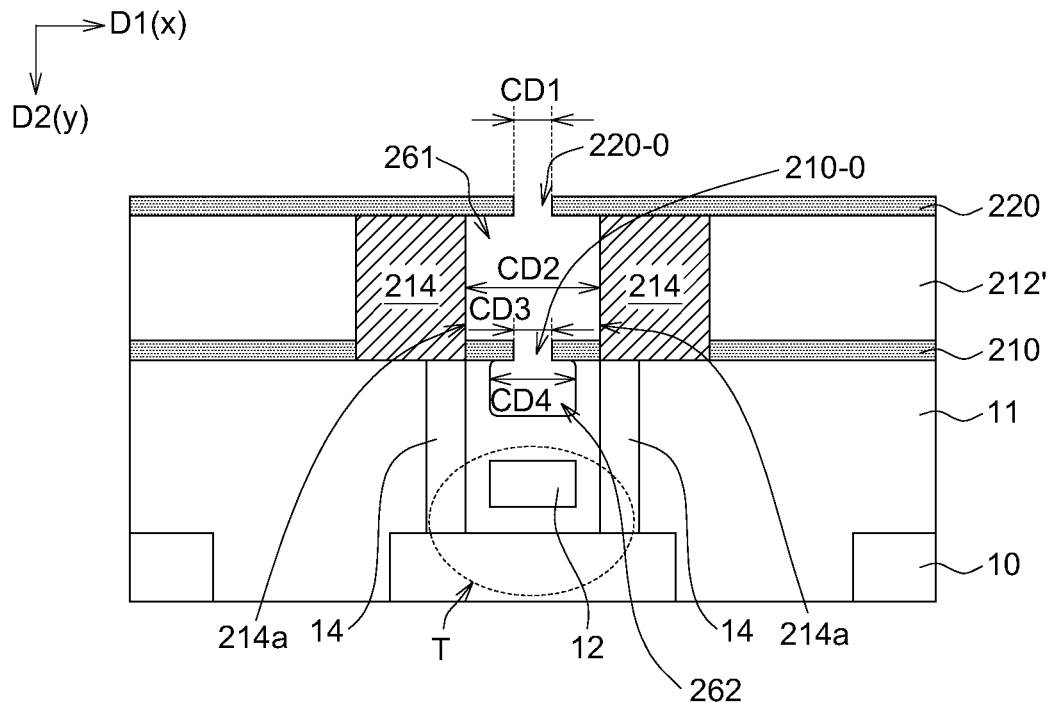
Figure 4C:
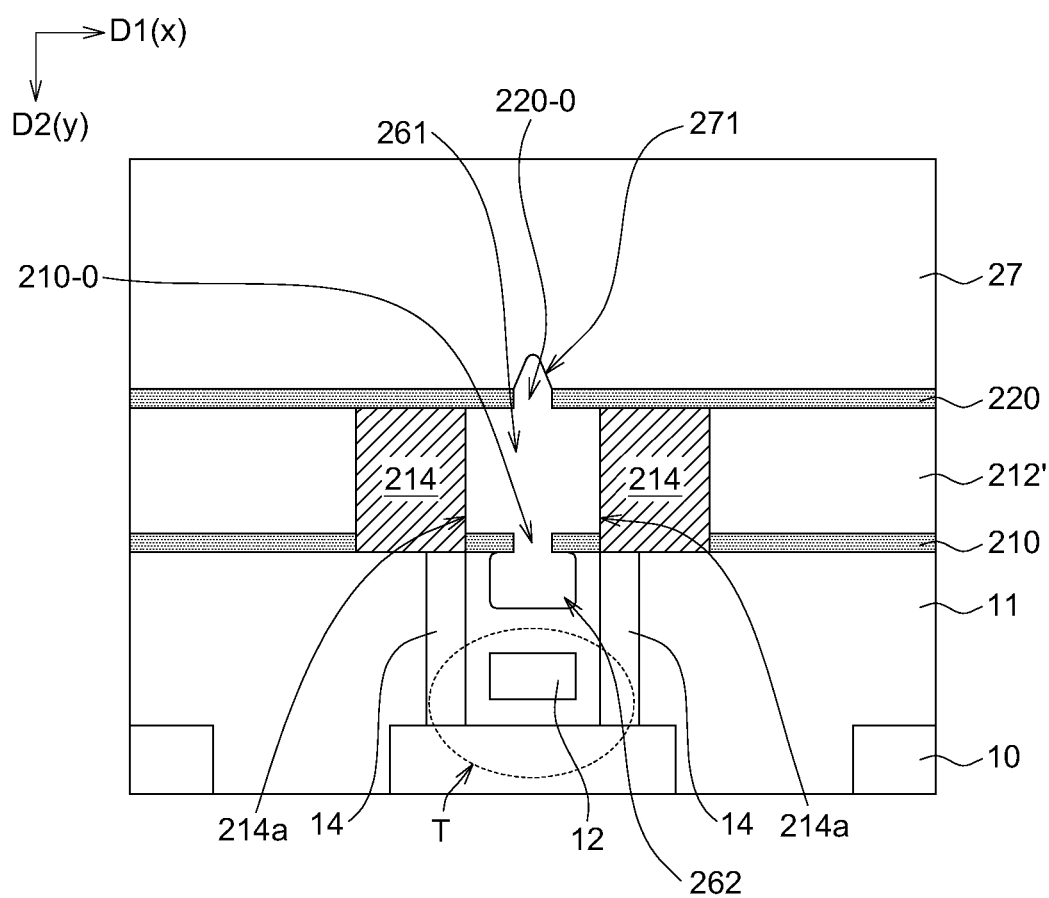

FIG. 4A-FIG. 4C show a method for forming a semiconductor device according to the second embodiment of the disclosure. The identical and/or similar elements of FIG. 4A-FIG. 4C and FIG. 1A-FIG. 1F are designated with the same and/or similar reference numerals for clear illustration. Also, the steps performed for obtaining the structure of FIG. 4A (for forming the first stop layer 210, the first dielectric layer 212/212', the second stop layer 220, the second trench 253, the opening 220-O, etc.) have been described above in the contents related to FIG. 1A-FIG. 1D, and those details are not redundantly repeated.

In the second embodiment, as shown in FIG. 4A, the second trench 253 extends to the first dielectric layer 212 to form the opening 220-O, and further extends to the first stop layer 210 to form another opening 210-O at the first stop layer 210.

Afterwards, as shown in FIG. 4B, a portion of the first dielectric layer 212' is removed through the opening 220-O at the second stop layer 220, and a portion of the lower dielectric layer 11 is removed through another opening 210-O at the first stop layer 210, thereby forming an air-gap 261 within the first dielectric layer 212' and between two adjacent the conductive lines 214, and simultaneously forming another air-gap 262 within the lower dielectric layer 11'. According to this embodiment, the air-gap 261 within the first dielectric layer 212' and the air-gap 262 within the lower dielectric layer 11' communicate each other through the opening 210-O at the first stop layer 210, as depicted in FIG. 4B.

As shown in FIG. 4C, a capping dielectric layer 27 is then formed on the second stop layer 220. Moreover, a void consisted of the opening 220-O and a slit above the opening 220-O can be maintained by adjusting the size of the opening 220-O and modifying the process conditions. For example, an air portion 271 can be generated in the capping dielectric layer 27, thereby reducing the parasitic capacitance of a semiconductor device in the application.

According to the embodiment, as shown in FIG. 4C, the opening 220-O at the second stop layer 220 has a first critical dimension CD1 along the first direction D1 (such as x-direction), and the air-gap 261 within the first dielectric layer 212' has a second critical dimension CD2 along the first direction D1, another opening 210-O at the first stop layer 210 has a third critical dimension CD3 along the first direction D1, and another air-gap 262 within the lower dielectric layer 11' has a fourth critical dimension CD4 along the first direction D1. In one example, the first critical dimension CD1 is smaller than the second critical dimension CD2. Also, in one example, the third critical dimension CD3 is smaller than the second critical dimension CD2, the fourth critical dimension CD4 is smaller than the second critical dimension CD2. In one example, the first critical dimension CD1 is equal to or less than at least ⅓ of the second critical dimension CD2.

Figure 5:
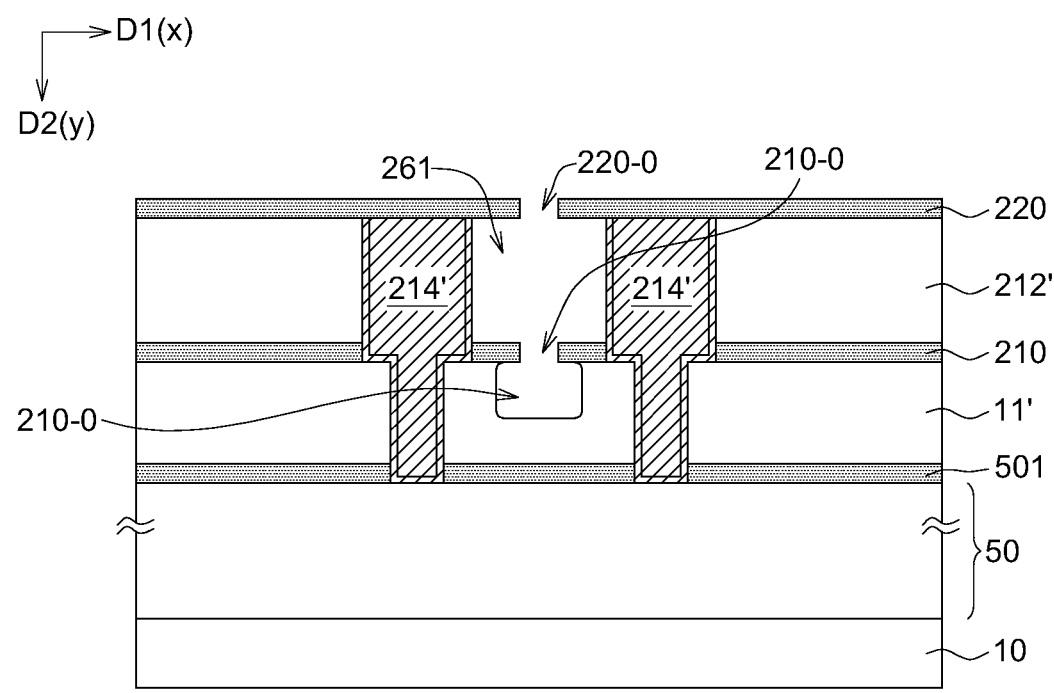
FIG. 5 depicts a cross-sectional view of another semiconductor device formed by the second embodiment of the disclosure.

It is, of course, that the disclosure is not limited to the above-described embodiments. FIG. 5 depicts a cross-sectional view of another semiconductor device formed by the second embodiment of the disclosure. The identical and/or similar elements of FIG. 5 and FIG. 4C are designated with the same and/or similar reference numerals for clear illustration. Details of the same components/elements have been described above, are not redundantly repeated herein. As shown in FIG. 5, the embodiment can be applied to a semiconductor device having a damascene structure of conductive lines 214'. Also, the openings 220-O and 210-O can be formed at two adjacent stop layers (i.e. 210 and 220), and the air-gaps 261 and 262 can be formed within two adjacent dielectric layers (11', 212') by using the method of the second embodiment. The method of the first embodiment (i.e. the second trench 252 stops at the first dielectric layer) is also applicable to form the opening 220-O and the air-gap 261 (as shown in FIG. 1F) between the conductive lines 214'.

Additionally, the semiconductor device of FIG. 5 (having a damascene structure of conductive lines) may further comprise a transistor, such as a transistor T depicted in FIG. 4C. Please refer to FIG. 4C, the lower dielectric layer 11 encapsulates the transistor T, and the first stop layer 210 is formed above the lower dielectric layer 11. In one example, the air-gap 262 within the lower dielectric layer 11 can be formed on the transistor T, and spaced apart from a gate electrode 12 of the transistor T. For example, a contact etch stop layer (CESL; not depicted in FIG. 4C) is deposited on the gate electrode 12, and the air-gap 262 and the gate electrode 12 are separated from each other by at least the CESL. Also, the semiconductor device of FIG. 5 further includes an interconnecting layer 50 on the substrate 10 and a bottom stop layer 501 on the interconnecting layer 50, wherein the damascene structure of conductive lines (such as the conductive lines 214') is disposed between the bottom stop layer 501 and the second stop layer 220.

Third Embodiment

The methods for forming the structures of the third and first embodiments are similar. In the third embodiment, a semiconductor device including an SOI structure as one of applications is exemplified.

Figure 6A:
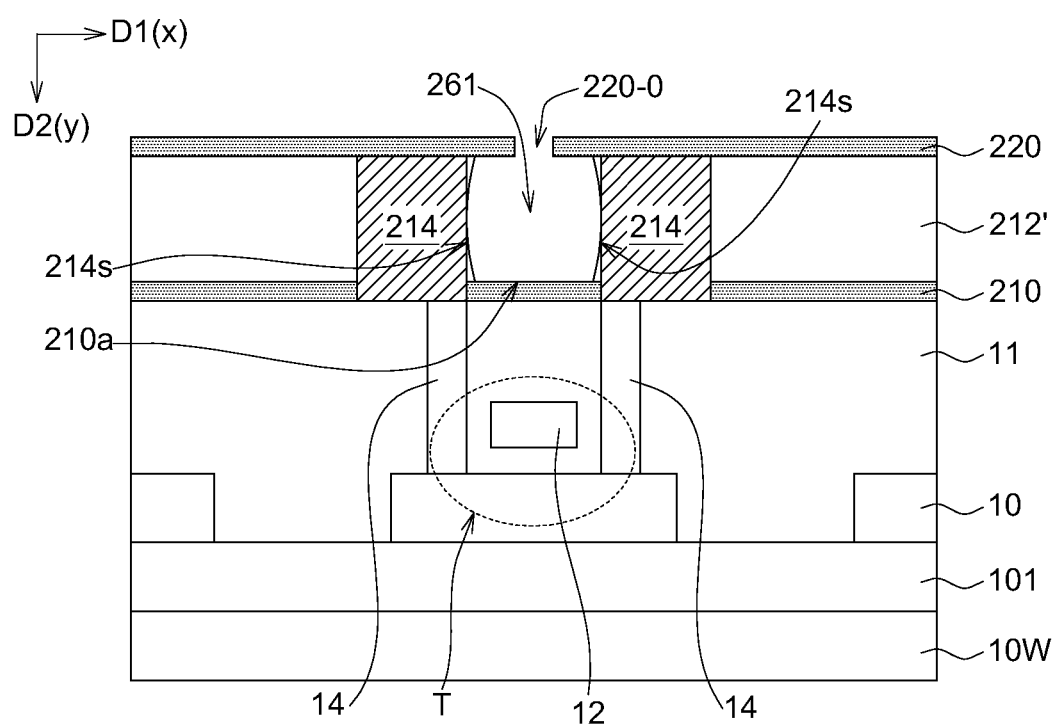
FIG. 6A and FIG. 6B depict the semiconductor devices formed by the third embodiment of the disclosure, obtained before and after depositing a covering dielectric layer.
Figure 6B:
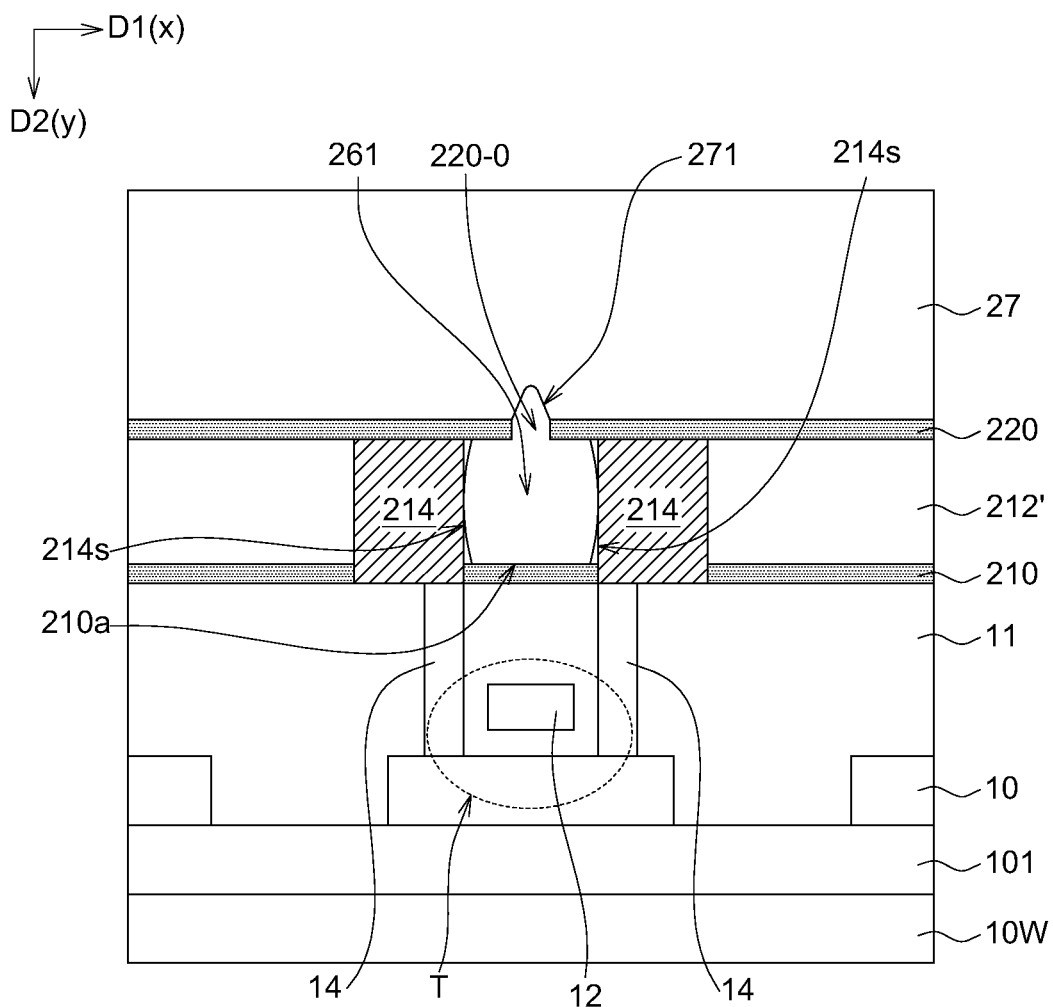

FIG. 6A and FIG. 6B depict the semiconductor devices formed by the third embodiment of the disclosure, obtained before and after depositing a covering dielectric layer. The identical and/or similar elements of FIG. 6A and FIG. 6B and FIG. 1A-FIG. 1F are designated with the same and/or similar reference numerals for clear illustration. Also, the steps performed for obtaining the structure of FIG. 6A (for forming the first stop layer 210, the first dielectric layer 212/212', the second stop layer 220, the second trench 252, the opening 220-O, etc.) have been described above in the contents related to FIG. 1A-FIG. 1E, and those details are not redundantly repeated. The difference between the first and third embodiments is that the method of the third embodiment is applied to a semiconductor device including an SOI structure, wherein the semiconductor device includes an insulating film 101 formed between a silicon wafer 10W and a thin silicon substrate 102. The transistor T formed on the thin silicon substrate 102 to improve the efficiency of the transistor T. Details of the same components/elements (such as the air-gap 261 and the opening 220-O) as depicted in FIG. 6A-FIG. 6B and FIG. 1A-FIG. 1F have been described in the first and second embodiments, and those contents are not redundantly repeated herein.

According to the aforementioned descriptions, a method of forming a semiconductor is provided without using a higher grade mask than a mask for defining conductive lines, wherein two dummy layers (e.g. dummy dielectric layers) are deposited to form a small hole (i.e. the first trench), and an etching back process can be applied to transfer the pattern of the first trench to the dielectric layer for forming the second trench between two adjacent conductive lines. The dielectric material between two adjacent conductive lines is then removed through the second trench, thereby forming an air-gap within the first dielectric layer. Thus, according to the method of the embodiment, it only requires a typical deposition process and a mask for defining conductive lines or a mask with lower grade for forming an air-gap between two adjacent conductive lines, a higher grade mask for defining metal lines (e.g. Cu lines) is not necessary; accordingly, the production cost does not increase. Additionally, the method of the embodiment forms an opening with a small critical dimension (CD) in one or more stop layers (e.g. the first stop layer in the first embodiment, or the first and second stop layers in the second embodiment) by using a self-aligned process (e.g. the second trench is aligned with the first trench), so that it is less likely that the dielectric material is dropped into the air gap when a capping dielectric layer is deposited over the stop layer. Moreover, an air-gap with a big CD can be generated between adjacent conductive lines through the opening with a small CD at the stop layer and the trench (i.e. the second trench), thereby significantly reducing the parasitic capacitance and preventing the related components from undesirable damages during the fabrication. The method of the embodiment is particularly suitable for the application of a size-reduced semiconductor device. The method of the embodiment of the application utilizes simple steps and effectively improves the electronic characteristics and production yield of the semiconductor device to be applied without increasing the production cost. The embodied method is suitable for mass production. The above-mentioned related elements/compositions/layers as exemplified in the embodiments, such as a typical substrate, an SOI substrate, a dielectric layer, a stop layer, a transistor, and a structure of conductive line, etc., are configured, arranged and sized for illustration. Therefore, those skilled in the art can use the contents as described in the scope of the disclosure to change and modify the configurations, arrangements and sizes of various related components/components/layers. The technique features described in one embodiment are not limited to the application of that embodiment. The applications include other possible examples of the structures, types, arrangement and dimensions as not clearly described in the above embodiments. Also, it is, of course, noted that the features of different embodiments can be combined and rearranged without departing from the spirit and scope of the present disclosure.

Details of the structure and steps as described above are provided for exemplifying some of the embodiments and applications. However, the disclosure is not limited to those embodiments. Other embodiments with different configurations, such as change on components of the related layers and the displaying elements to meet practical requirements can be applicable. Thus, steps and structures as described in the drawings and embodiments are provided for exemplification only, not for limitation. It is known by people skilled in the art that the configurations and the procedure details of the related components/layers could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor device, comprising:
   providing a structure comprising a first stop layer formed above a substrate, a first dielectric layer formed on the first stop layer, a second stop layer formed on the first dielectric layer, and conductive lines formed in the first dielectric layer and spaced apart from each other;
   forming a first dummy layer on the second stop layer;
   patterning the first dummy layer to form a first patterned dummy layer;
   forming a second dummy layer on the first patterned dummy layer to form a first trench; and
   etching back the second dummy layer and the first patterned dummy layer to form a second trench, wherein the second trench is self-aligned with the first trench; wherein the second trench extends downwardly to the first dielectric layer and forms an opening at the second stop layer.

2. The method according to claim 1, further comprising:
   removing a portion of the first dielectric layer through the opening at the second stop layer, thereby forming an air-gap within the first dielectric layer and between two of the conductive lines disposed adjacently.

3. The method according to claim 2, further comprising:
   forming a capping dielectric layer on the second stop layer.

4. The method according to claim 2, wherein outer sidewalls of the two of the conductive lines are at least partially exposed by the air-gap within the first dielectric layer.

5. The method according to claim 1, wherein the second trench further extends to the first stop layer, and forms another opening at the first stop layer.

6. The method according to claim 5, wherein a lower dielectric layer is formed under the first stop layer, and the method further comprise:
   removing a portion of the first dielectric layer through the opening at the second stop layer, and removing another portion of the lower dielectric layer through the another opening at the first stop layer,
   thereby forming an air-gap within the first dielectric layer and between two of the conductive lines disposed adjacently, and forming another air-gap within the lower dielectric layer simultaneously.

7. The method according to claim 6, wherein the air-gap within the first dielectric layer and the another air-gap within the lower dielectric layer communicate each other through the another opening at the first stop layer.

8. The method according to claim 6, wherein the opening at the second stop layer has a first critical dimension along a first direction, and the air-gap within the first dielectric layer has a second critical dimension along the first direction, wherein the first critical dimension is equal to or less than at least ⅓ of the second critical dimension.

9. The method according to claim 6, wherein the opening at the second stop layer has a first critical dimension along a first direction, the air-gap within the first dielectric layer has a second critical dimension along the first direction, the another opening at the first stop layer has a third critical dimension along the first direction, and the another air-gap within the lower dielectric layer has a fourth critical dimension along the first direction, wherein the third critical dimension is smaller than the second critical dimension, and the fourth critical dimension is smaller than the second critical dimension.

10. The method according to claim 6, further comprising:
    forming a capping dielectric layer on the second stop layer.

11. The method according to claim 1, wherein a thickness of the second dummy layer is less than ½ of a critical dimension of the first trench.

12. The method according to claim 1, wherein the second dummy layer has a thickness in a range of ¼ to ⅓ of a critical dimension of the first trench.

13. A semiconductor device, comprising:
    a first stop layer, formed above a substrate;
    a first dielectric layer, formed on the first stop layer;
    conductive lines, formed in the first dielectric layer and spaced apart from each other;

a second stop layer, formed on the first dielectric layer and having an opening; and an air-gap, formed within the first dielectric layer and positioned between two of the conductive lines disposed adjacently;

wherein the first stop layer has another opening communicating the air-gap.

14. The semiconductor device according to claim 13, wherein the opening at the second stop layer has a first critical dimension along a first direction, the air-gap within the first dielectric layer has a second critical dimension along the first direction, and the another portion of the lower dielectric layer has a third critical dimension along the first direction, wherein the second critical dimension is larger than the first critical dimension, and the third critical dimension is smaller than the second critical dimension.

15. The semiconductor device according to claim 13, further comprising:

a lower dielectric layer, formed under the first stop layer; and another air-gap, formed within the lower dielectric layer, wherein the air-gap within the first dielectric layer and the another air-gap within the lower dielectric layer communicate each other through the another opening at the first stop layer.

16. The semiconductor device according to claim 15, wherein the opening at the second stop layer has a first critical dimension along a first direction, the air-gap within the first dielectric layer has a second critical dimension along the first direction, the another opening at the first stop layer has a third critical dimension along the first direction, and the another air-gap within the lower dielectric layer has a fourth critical dimension along the first direction, wherein the third critical dimension is smaller than the second critical dimension, and the fourth critical dimension is smaller than the second critical dimension.

17. The semiconductor device according to claim 13, further comprising a capping dielectric layer formed on the second stop layer, wherein an air portion is formed in the capping dielectric layer corresponding to a position of the opening at the second stop layer.

18. The semiconductor device according to claim 13, wherein outer sidewalls of the two of the conductive lines are at least partially exposed by the air-gap within the first dielectric layer.

19. The semiconductor device according to claim 13, further comprising a transistor formed on the substrate, wherein the first stop layer is formed above the transistor, and the conductive lines are electrically connected to the transistor.

20. The semiconductor device according to claim 19, further comprising:

a lower dielectric layer encapsulating the transistor, and the first stop layer formed on the lower dielectric layer; and another air-gap, formed within the lower dielectric layer, wherein the air-gap within the first dielectric layer and the another air-gap within the lower dielectric layer communicate each other through the another opening at the first stop layer, and wherein the another air gap is formed above the transistor and spaced apart from a gate electrode of the transistor.

* * * * *